United States Patent
Chen et al.

(10) Patent No.: US 8,643,006 B2
(45) Date of Patent: Feb. 4, 2014

(54) THIN FILM TRANSISTOR HAVING A PATTERNED PASSIVATION LAYER

(75) Inventors: Chia-Hsiang Chen, Tainan (TW); Ming-Chin Hung, Nantou County (TW); Chun-Hao Tu, Changhua County (TW); Wei-Ting Lin, New Taipei (TW); Jiun-Jye Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 99 days.

(21) Appl. No.: 13/163,727

(22) Filed: Jun. 20, 2011

(65) Prior Publication Data
US 2012/0267621 A1    Oct. 25, 2012

(30) Foreign Application Priority Data
Apr. 22, 2011 (TW) ............................. 100114110 A (51) Int. Cl.
*H01L 29/786* (2006.01)
(52) U.S. Cl.
USPC ........................................................... 257/43
(58) Field of Classification Search
USPC ................................................ 257/59, 43, 72
See application file for complete search history.

(56) References Cited

U.S. PATENT DOCUMENTS

| | | | |
|---|---|---|---|
| 7,382,421 B2 | 6/2008 | Hoffman et al. | |
| 8,158,466 B2* | 4/2012 | Kim et al. | 438/149 |
| 8,258,021 B2* | 9/2012 | Ng et al. | 438/149 |
| 8,258,511 B2* | 9/2012 | Ye | 257/57 |
| 8,274,079 B2* | 9/2012 | Yamazaki | 257/43 |
| 8,294,147 B2* | 10/2012 | Yamazaki et al. | 257/43 |
| 8,299,460 B2* | 10/2012 | Chen et al. | 257/43 |
| 8,304,773 B2* | 11/2012 | Shimada | 257/59 |
| 8,319,221 B2* | 11/2012 | Choi et al. | 257/59 |
| 2010/0134735 A1* | 6/2010 | Nakamura et al. | 349/116 |
| 2010/0163865 A1* | 7/2010 | Arai | 257/43 |
| 2010/0200857 A1* | 8/2010 | Shimada | 257/59 |
| 2010/0301340 A1* | 12/2010 | Shih et al. | 257/59 |
| 2010/0308324 A1* | 12/2010 | Kim et al. | 257/43 |

FOREIGN PATENT DOCUMENTS

| | | |
|---|---|---|
| CN | 2729758 | 9/2005 |
| CN | 101976650 | 2/2011 |
| TW | 200629458 | 8/2006 |

OTHER PUBLICATIONS

"First Office Action of China Counterpart Application", issued on Mar. 5, 2013, p. 1-p. 8.

\* cited by examiner

*Primary Examiner* — Nathan Ha
(74) *Attorney, Agent, or Firm* — Jianq Chyun IP Office (57) ABSTRACT

A thin film transistor is provided. The thin film transistor includes a substrate, a gate, a gate insulating layer, a source and a drain, a channel layer, and first and second patterned passivation layers. The gate is disposed on the substrate. The gate insulating layer is disposed on the gate. The source and the drain are disposed on the gate insulating layer. The channel layer is disposed above or under the source and the drain, wherein a portion of the channel layer is exposed between the source and the drain. The first patterned passivation layer is disposed on the portion of the channel layer, wherein the first patterned passivation layer includes metal oxide, and the first patterned passivation layer has a thickness ranging from 50 angstroms to 300 angstroms. The second patterned passivation layer covers the first patterned passivation layer, the gate insulating layer, and the source and the drain.

9 Claims, 9 Drawing Sheets

THIN FILM TRANSISTOR HAVING A PATTERNED PASSIVATION LAYER

CROSS-REFERENCE TO RELATED APPLICATION

This application claims the priority benefit of Taiwan application serial no. 100114110, filed Apr. 22, 2011. The entirety of the above-mentioned patent application is hereby incorporated by reference herein and made a part of this specification.

BACKGROUND OF THE INVENTION

1. Field of the Invention

The invention relates to a semiconductor device and a fabrication method thereof, and more particularly to a thin film transistor and a fabrication method thereof.

2. Description of Related Art

In general, a liquid crystal display (LCD) mainly includes a thin film transistor (TFT) array substrate, a color filter substrate, and a liquid crystal layer sandwiched between the two substrates. An amorphous silicon TFT or a low temperature polysilicon TFT is usually adopted as a switch device of each sub-pixel in the TFT array substrate. In recent years, it is reported that, the oxide semiconductor TFT has relatively high carrier mobility in comparative with the amorphous silicon TFT. In addition, compared with the low temperature polysilicon TFT, the oxide semiconductor TFT has advantages of large area manufacturing and low manufacturing cost. As such, the oxide semiconductor TFT has high potential in development and may become the key device in the next generation of flat panel displays.

However, the stability of the oxide semiconductor TFT is likely to be influenced by external moisture and diffusion of hydrogen ions in the passivation layer. The existing passivation layer for mass production is usually formed by the plasma enhanced chemical vapor deposition process (PECVD), and the oxide semiconductor may be doped with hydrogen ions when the plasma is dissociated. As a result, the threshold voltage shift is increased. On the other hand, if a non-hydrogen film is formed by PVD, the yield is decreased because the sputtering rate of the film is low, and the capacitance coupling between the metal layers is generated due to high dielectric constant of the non-hydrogen film. Moreover, during the etching process, an etching undercut may occur in the passivation layer and the underlying gate insulating layer, causing the discontinuous formation of the pixel electrode on the passivation layer.

SUMMARY OF THE INVENTION

The invention is directed to a thin film transistor having favorable stability.

The invention is further directed to a fabrication method of a thin film transistor, so as to reduce the fabrication time, to reduce the capacitive coupling effects, to prevent the etching undercut issue and to improve stability of the thin film transistor.

The invention provides a thin film transistor. The thin film transistor includes a substrate, a gate, a gate insulating layer, a source and a drain, a channel layer, a first patterned passivation layer, and a second patterned passivation layer. The gate is disposed on the substrate. The gate insulating layer is disposed on the gate. The source and the drain are disposed on the gate insulating layer. The channel layer is disposed above or under the source and the drain, wherein a portion of the channel layer is exposed between the source and the drain. The first patterned passivation layer is disposed on the portion of the channel layer, wherein the first patterned passivation layer includes a metal oxide, and the first patterned passivation layer has a thickness ranging from 50 angstroms to 300 angstroms. The second patterned passivation layer covers the first patterned passivation layer, the gate insulating layer, and the source and the drain.

The invention further provides a fabrication method of a thin film transistor. A gate is formed on a substrate. A gate insulating layer is formed on the gate. A source and a drain are formed on the gate insulating layer. A channel layer is formed, wherein the channel layer is disposed above or under the source and the drain, and a portion of the channel layer is exposed between the source and the drain. A first patterned passivation layer is formed on the portion of the channel layer, wherein the first patterned passivation layer includes a metal oxide, and the first patterned passivation layer has a thickness ranging from 50 angstroms to 300 angstroms. A second patterned passivation layer is formed, so as to cover the first patterned passivation layer, the gate insulating layer, and the source and the drain.

Based on the above, in the thin film transistor and the fabrication method thereof, the first patterned passivation layer includes metal oxide, and the first patterned passivation layer and the channel layer are patterned simultaneously. Therefore, the etching undercut issue of the first patterned passivation layer and the gate insulating layer is prevented. Moreover, the thickness of the first patterned passivation layer ranges from 50 angstroms to 300 angstroms, and the second patterned passivation layer is formed on the first patterned passivation layer. As such, the combination of the first and the second patterned passivation layers prevent external moisture from entering the channel layer, and the first and the second patterned passivation layers which are non-hydrogen films avoid hydrogen ions diffusing into the channel layer. Therefore, the thin film transistor has favorable stability. In addition, the first patterned passivation layer can be formed with a relatively small thickness because of the formed second patterned passivation layer, and thus the sputtering time and the etching time of the TFT can be reduced and the capacitive coupling effects between the metal layers are decreased.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

The First Embodiment

FIG. 1A to FIG. 1F are schematic cross-sectional views showing a fabrication method of a thin film transistor according to the first embodiment of the invention. Reference with FIG. 1A, first, a gate 110 is formed on a substrate 102. In this embodiment, the substrate 102 can be a glass substrate or other suitable substrate, which is not limited in the invention. The gate 110 may have a single-layer or multiple-layer structure of the conductive material, and the conductive material can be selected from the group consisting of copper (Cu), molybdenum (Mo), titanium (Ti), aluminum (Al), tungsten (W), silver (Ag), gold (Au), and an alloy thereof. A method of forming the gate 110 is patterning a conductive layer by photolithography and etching processes, for example. In this embodiment, the gate 110 has, for example, a stacked structure of titanium/aluminum/titanium.

Figure 1A:
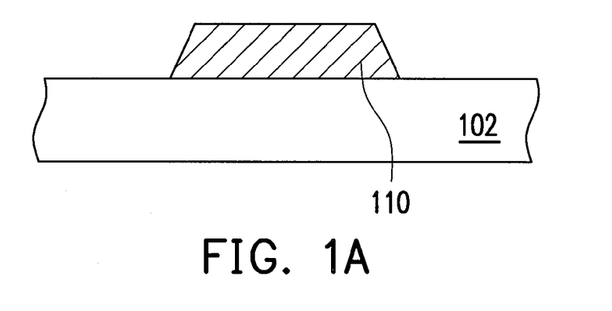
FIG. 1A to FIG. 1F are schematic cross-sectional views showing a fabrication method of a thin film transistor according to a first embodiment of the invention.
Figure 1B:
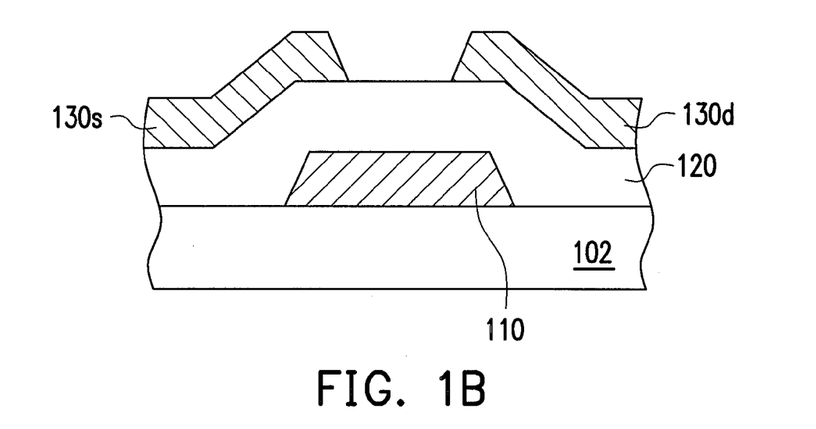

Reference with FIG. 1B, then, a gate insulating layer 120 is formed on the gate 110. The gate insulating layer 120 may have a single-layer or multiple-layer structure, and a material thereof may be dielectric material such as silicon oxide, silicon nitride or silicon oxynitride.

Next, a source 130s and a drain 130d are formed on the gate insulating layer 120. In this embodiment, the source 130s and the drain 130d are formed on respective sides of the gate 110. The source 130s and the drain 130d may have a single-layer or multiple-layer structure of conductive material, and the conductive material can be selected from the group consisting of copper (Cu), molybdenum (Mo), titanium (Ti), aluminum (Al), tungsten (W), silver (Ag), gold (Au), and an alloy thereof. A method of forming the source 130s and the drain 130d is patterning a conductive layer by photolithography and etching processes, for example. In this embodiment, the source 130s and the drain 130d are respectively, for example, a stacked structure of titanium/aluminum/titanium.

Figure 1C:
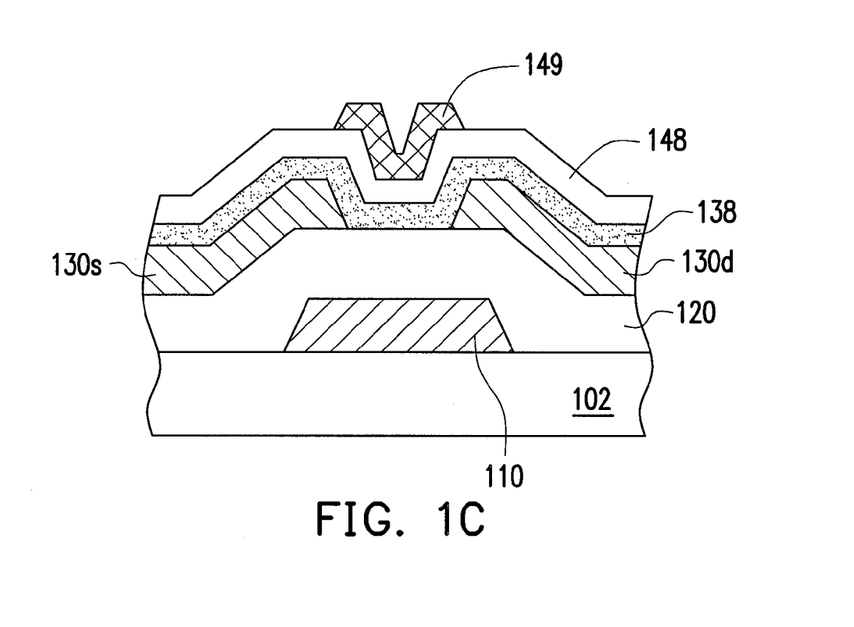
Figure 1D:
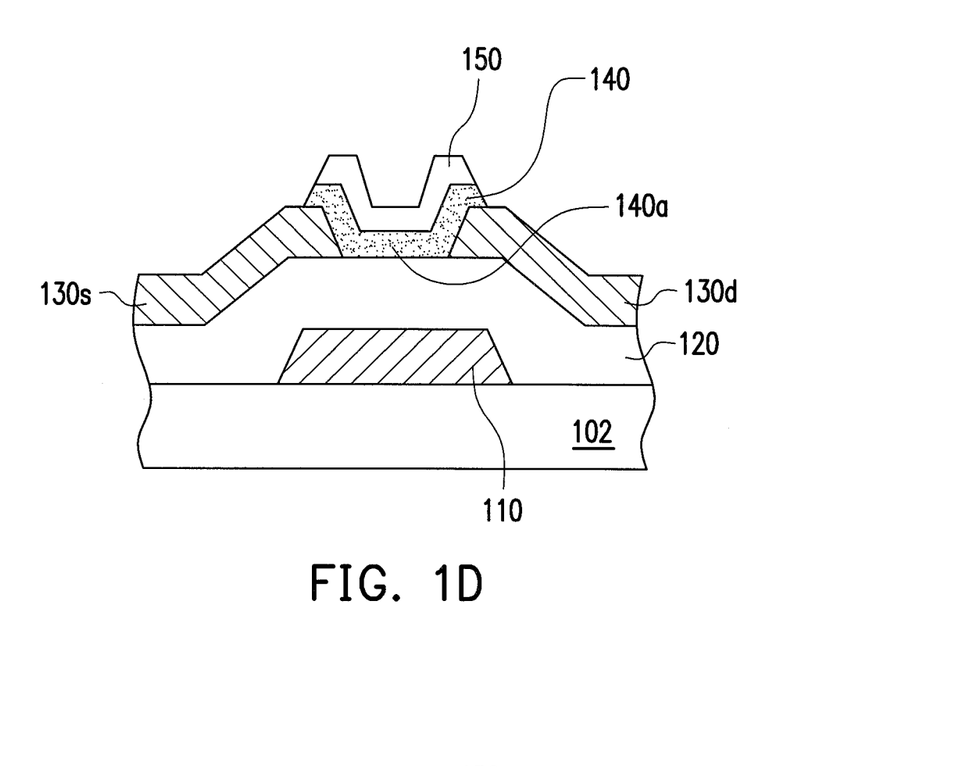

Reference with FIGS. 1C and 1D, after that, a channel layer 140 is formed, wherein the channel layer 140 is disposed above the source 130s and the drain 130d, and a portion 140a of the channel layer 140 is exposed between the source 130s and the drain 130d. Thereafter, a first patterned passivation layer 150 is formed on the portion 140a of the channel layer 140, wherein the first patterned passivation layer 150 includes a metal oxide, and the first patterned passivation layer 150 has a thickness ranging from 50 angstroms to 300 angstroms. In this embodiment, the channel layer 140 is, for example, disposed between the source 130s and the drain 130d. A thickness of the first patterned passivation layer 150 is 100 angstroms, for example.

In this embodiment, a method of forming the channel layer 140 and the first patterned passivation layer 150 includes following steps. First, as shown in FIG. 1C, a channel material layer 138 and a first passivation material layer 148 are sequentially formed on the source 130s and the drain 130d by a physical vapor deposition (PVD) system. In other words, the channel material layer 138 and the first passivation material layer 148 are deposited as the vacuum is not broken. In this embodiment, a material of the channel material layer 138 includes IGZO, ZnO, SnO, or $SnO_2$, for example. A material of the first passivation material layer 148 includes $Al_2O_3$, $TiO_x$, $HfO_x$, or $TaO_x$, and preferably includes $Al_2O_3$, for example. A mask layer 149 is then formed on the first passivation material layer 148. Next, as shown in FIG. 1D, using the mask layer 149 as a mask, the channel material layer 138 and the first passivation material layer 148 are patterned, so as to form the channel layer 140 and the first patterned passivation layer 150. In other words, in this embodiment, the channel material layer 138 and the first passivation material layer 148 are patterned by using the same mask layer 149 in the same photolithography and etching processes to form the channel layer 140 and the first patterned passivation layer 150, thereby simplifying the process and reducing the fabrication time.

Figure 1E:
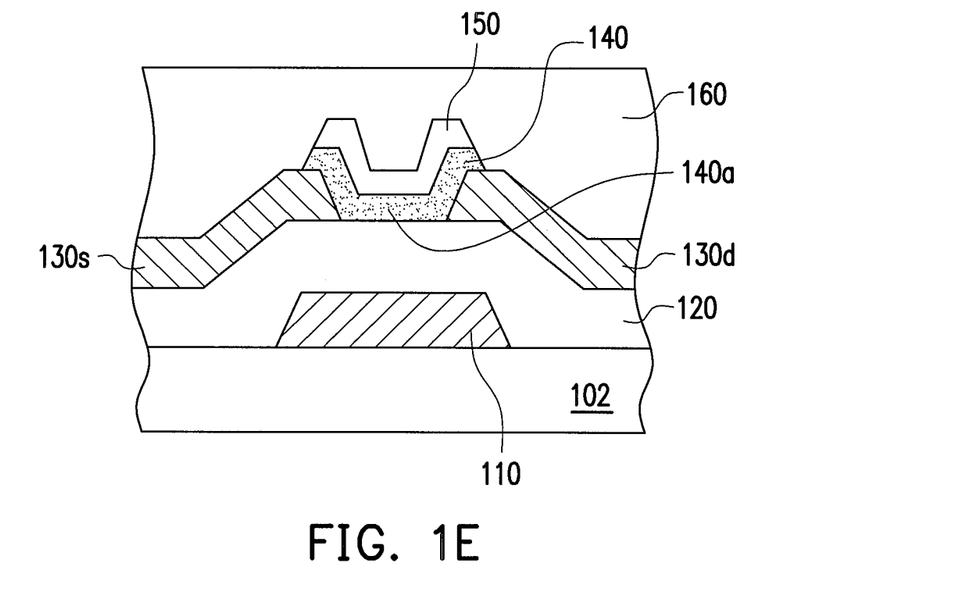

Reference with FIG. 1E, a second patterned passivation layer 160 is formed, so as to cover the first patterned passivation layer 150, the gate insulating layer 120, and the source 130s and the drain 130d. A material of the second patterned passivation layer 160 can be an organic insulating material, and the organic insulating material can be acrylic polymer, cycloolefin polymer, epoxy resin, siloxane, fluorine polymer, or a combination thereof. A method of forming the second patterned passivation layer 160 is coating, for example. A thickness of the second patterned passivation layer 160 ranges from 0.2 um to 3 um, for example. In this embodiment, a material of the second patterned passivation layer 160 is acrylic polymer, and the thickness of the second patterned passivation layer 160 is 1.5 um, for example.

Figure 1F:
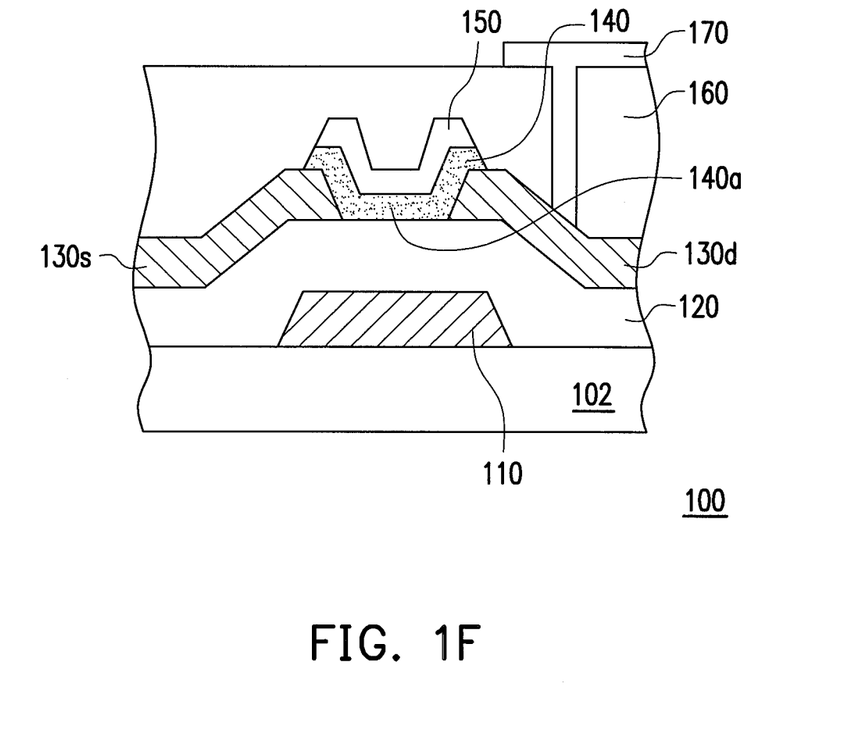

Reference with FIG. 1F, afterwards, a pixel electrode 170 is formed, and the pixel electrode 170 is electrically with the drain 130d through the opening in the second patterned passivation layer 160. Here, a material of the pixel electrode 170 is ITO, for example.

In this embodiment, the thin film transistor 100 includes the substrate 102, the gate 110, the gate insulating layer 120, the source 130s and the drain 130d, the channel layer 140, the first patterned passivation layer 150, the second patterned passivation layer 160, and the pixel electrode 170. The gate 110 is disposed on the substrate 102. The gate insulating layer 120 is disposed on the gate 110. The source 130s and the drain 130d are disposed on the gate insulating layer 120 and above respective sides of the gate 110. The channel layer 140 is disposed above the source 130s and the drain 130d, and is disposed between the first patterned passivation layer 150 and the source 130s and the drain 130d. Herein, the portion 140a of the channel layer 140 is exposed between the source 130s and the drain 130d. The first patterned passivation layer 150 is disposed on and covers the portion 140a of the channel layer 140, wherein the first patterned passivation layer 150 includes a metal oxide, and the first patterned passivation layer 150 has a thickness ranging from 50 angstroms to 300 angstroms. The second patterned passivation layer 160 covers the first patterned passivation layer 150, the gate insulating layer 120, and the source 130s and the drain 130d.

In this embodiment, as the portion 140a of the channel layer 140 exposed between the source 130s and the drain 130d is covered by the first patterned passivation layer 150, the channel layer 140 is prevented from being influenced by the external environment, and therefore the thin film transistor 100 has favorable stability. Moreover, the channel layer 140 and the first patterned passivation layer 150 are formed by the same PVD process, that is, the channel layer 140 and the first patterned passivation layer 150 can be deposited as the vacuum is not broken. As such, the interface of the channel layer 140 and the first patterned passivation layer 150 is prevented from adhering by the moisture or other contaminants, which resulting from contacting with atmosphere as the vacuum is broken, and the device characteristics of the thin film transistor 100 are improved. Besides, the channel layer 140 and the first patterned passivation layer 150 may be patterned in the same photolithography and etching processes, thereby preventing the etching undercut occurring in the first patterned passivation layer and the gate insulating layer due to the low etching rate of the first patterned passivation layer. As a result, the conductive layer, such as a pixel electrode layer, formed on the first patterned passivation layer is prevented from being discontinuous and broken. On the other hand, since the second patterned passivation layer 160 can be formed by coating and other suitable methods, the processes (i.e., PECVD) causing the diffusion of hydrogen ions are not required. Thus, the device characteristics of the thin film transistor are not deteriorated by the forming process of the passivation layer.

Generally, a metal oxide passivation layer (i.e., aluminum oxide passivation layer) is a good barrier for blocking moisture and is substantially a non-hydrogen film. However, the metal oxide passivation layer has a shortage of low deposition rate, which resulting in the etching undercut in the metal oxide passivation layer and the gate insulating layer, and thus the fabrication time of the TFT is increased and the conductive layer formed on the metal oxide passivation layer is likely to be discontinuous. As such, the TFT having the metal oxide passivation layer is not suitable for mass production. On the contrary, in this embodiment, the first patterned passivation layer is formed by metal oxide such as aluminum oxide, and then the second patterned passivation layer is formed by organic material. As the first and second patterned passivation layers are used together, the first patterned passivation layer having a small thickness can have favorable blocking effects, the fabrication time of the metal oxide passivation layer is greatly reduced, and the method of fabrication the thin film transistor is suitable applied for mass production. Particularly, the combination of the first and second patterned passivation layers can efficiently prevent the moisture and the hydrogen ions from diffusion into the channel layer. On the other hand, the capacity coupling effect is likely to occur as the metal oxide (i.e., aluminum oxide) having high dielectric constant is used, and in this embodiment, the double-layer passivation structure constituting of the first and second patterned passivation layers can prevent the capacity coupling effects efficiently. In other words, the TFT of the embodiment has favorable device characteristics and stability, and time of sputtering and etching processes is greatly reduced.

The Second Embodiment

Figure 2A:
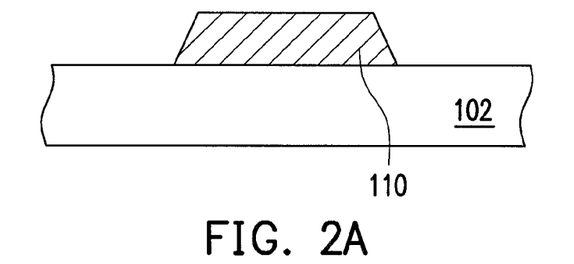
FIG. 2A to FIG. 2F are schematic cross-sectional views showing a fabrication method of a thin film transistor according to a second embodiment of the invention.

FIG. 2A to FIG. 2F are schematic cross-sectional views showing a fabrication method of a thin film transistor according to a second embodiment of the invention. With reference to FIG. 2A, first, a gate 110 is formed on a substrate 102. According to the present embodiment, materials of the substrate 102 and the gate 110 are similar to those provided in the first embodiment, and thus further descriptions are omitted.

Figure 2B:
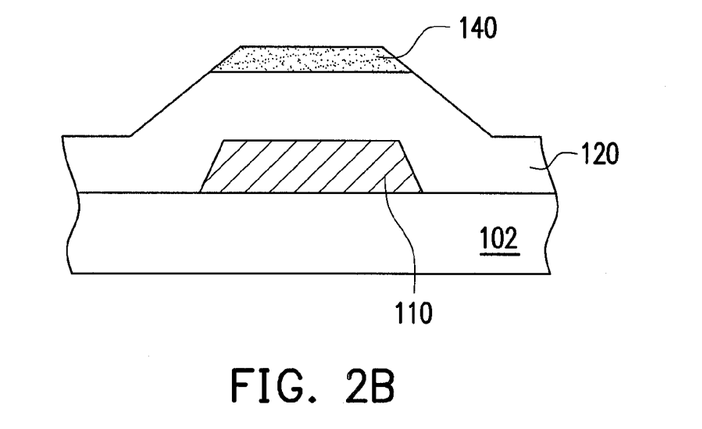

Reference with FIG. 2B, then, a gate insulating layer 120 is formed on the gate 110. The gate insulating layer 120 may have a single-layer or multiple-layer structure, and a material thereof may be dielectric material such as silicon oxide, silicon nitride or silicon oxynitride.

Next, a channel layer 140 is formed on the gate insulating layer 120. A material of the channel layer 140 includes IGZO, and a method of forming the channel layer 140 includes PVD, for example.

Figure 2C:
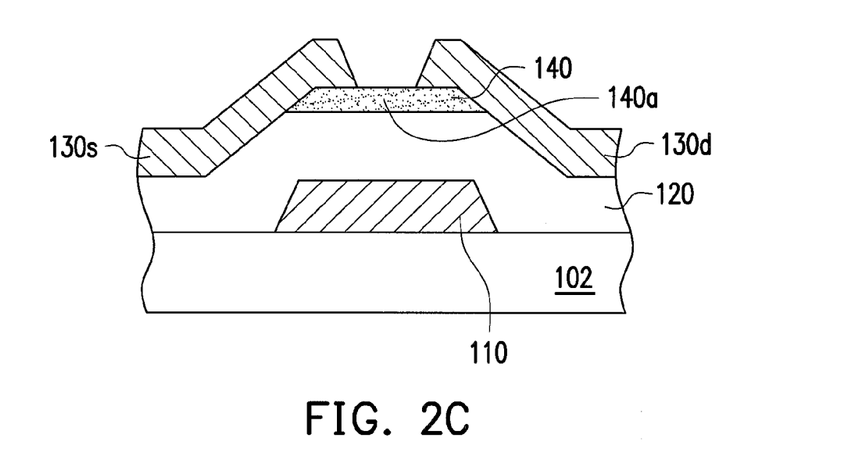

Reference with FIG. 2C, a source 130s and a drain 130d are formed on the channel layer 140, wherein a portion 140a of the channel layer 140 is exposed between the source 130s and the drain 130d. In this embodiment, the channel layer 140 is disposed under the source 130s and the drain 130d, and the source 130s and the drain 130d are formed above respective sides of the gate 110, for example. According to the present embodiment, materials and the forming method of the source 130s and the drain 130d are similar to those provided in the first embodiment, and thus further descriptions are omitted.

Figure 2D:
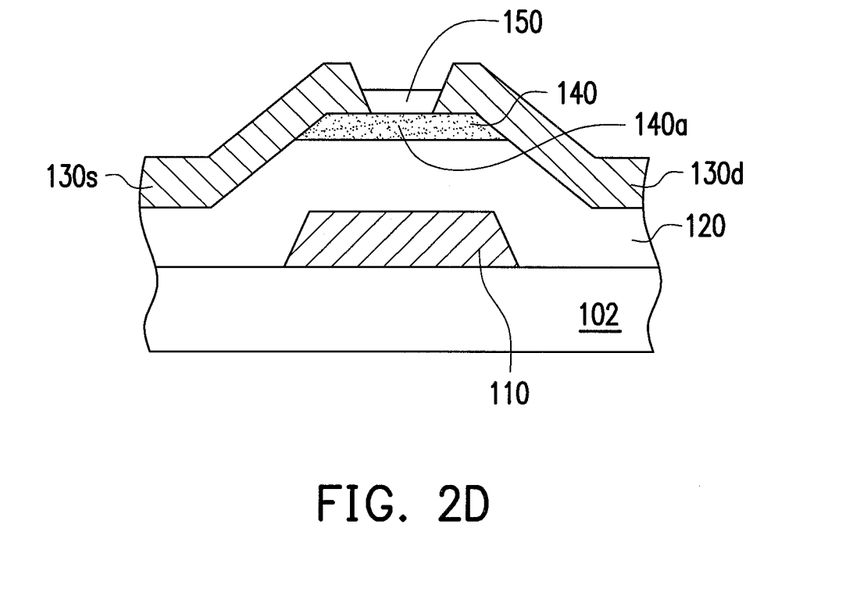

Reference with FIG. 2D, thereafter, a first patterned passivation layer 150 is formed on the portion 140a of the channel layer 140, wherein the first patterned passivation layer 150 includes a metal oxide, and the first patterned passivation layer 150 has a thickness ranging from 50 angstroms to 300 angstroms. In this embodiment, a thickness of the first patterned passivation layer 150 is 100 angstroms, for example. A material of the first passivation material layer 150, for example, includes $Al_2O_3$, $TiO_x$, $HfO_x$, or $TaO_x$, and preferably includes $Al_2O_3$. A forming method of the first patterned passivation layer 150 includes forming a passivation material layer and then performing photolithography and etching processes on the passivation material layer. Herein, a method of forming the first patterned passivation layer 150 includes PVD, for example.

Figure 2E:
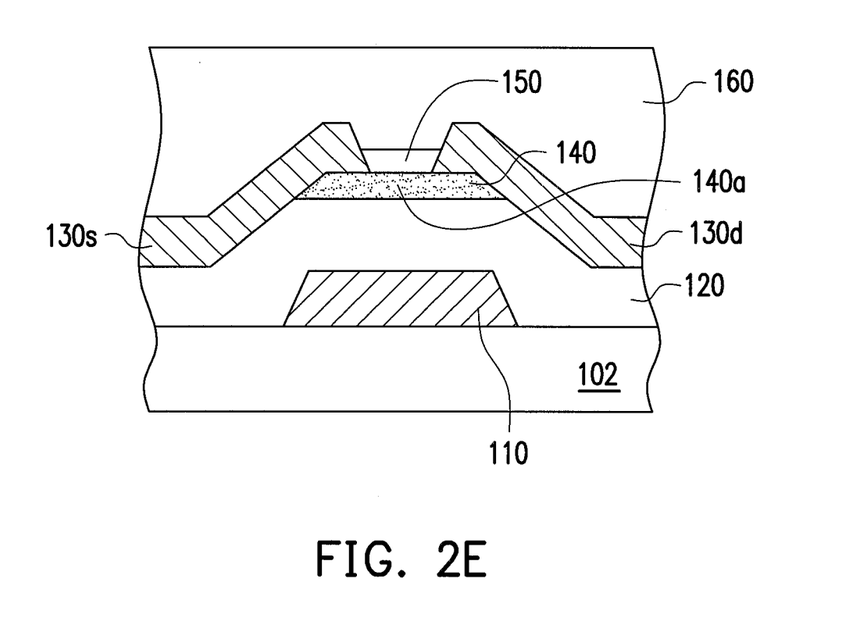

Reference with FIG. 2E, a second patterned passivation layer 160 is formed, so as to cover the first patterned passivation layer 150, the gate insulating layer 120, and the source 130s and the drain 130d. A material of the second patterned passivation layer 160 can be an organic insulating material, and the organic insulating material can be acrylic polymer, cycloolefin polymer, epoxy resin, siloxane, fluoride polymer, or a combination thereof. A method of forming the second patterned passivation layer 160 is coating, for example. A thickness of the second patterned passivation layer 160 ranges from 0.2 um to 3 um, and preferably 1.5 um, for example.

Figure 2F:
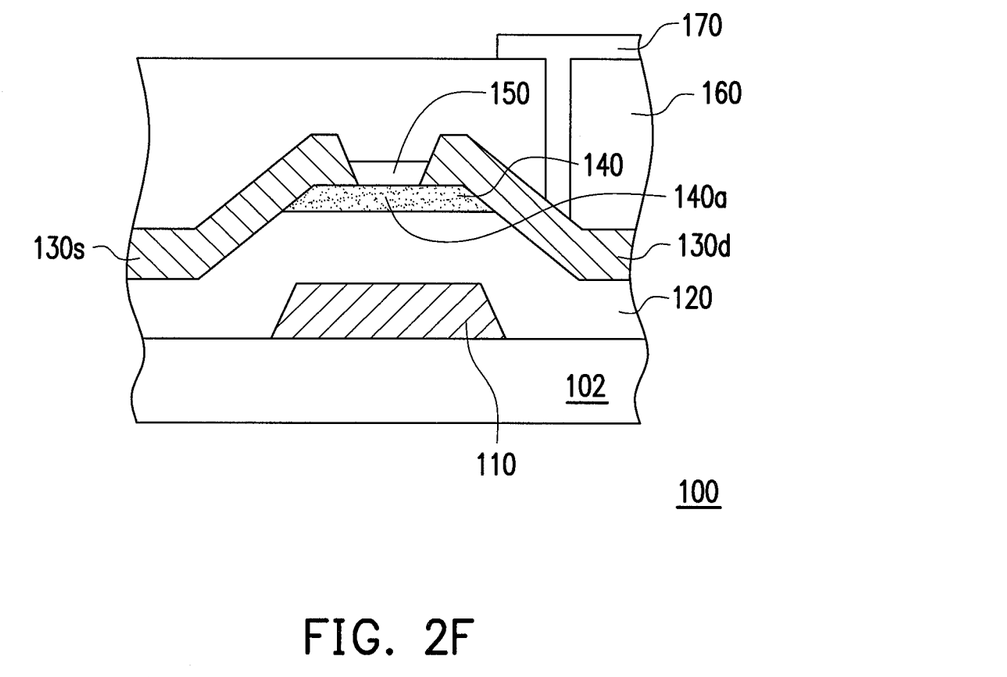

Reference with FIG. 2F, afterwards, a pixel electrode 170 is formed, and the pixel electrode 170 is electrically with the drain 130d through the opening in the second patterned passivation layer 160. Here, a material of the pixel electrode 170 is ITO, for example.

In this embodiment, the thin film transistor 100 includes the substrate 102, the gate 110, the gate insulating layer 120, the source 130s and the drain 130d, the channel layer 140, the first patterned passivation layer 150, the second patterned passivation layer 160, and the pixel electrode 170. The gate 110 is disposed on the substrate 102. The gate insulating layer 120 is disposed on the gate 110. The source 130s and the drain 130d are disposed on the gate insulating layer 120. The channel layer 140 is disposed under the source 130s and the drain 130d, and is disposed between the gate insulating layer 120 and the source 130s and the drain 130d. Herein, the portion 140a of the channel layer 140 is exposed between the source 130s and the drain 130d. The first patterned passivation layer 150 is disposed on the portion 140a of the channel layer 140, wherein the first patterned passivation layer 150 includes a metal oxide, and the first patterned passivation layer 150 has a thickness ranging from 50 angstroms to 300 angstroms. The second patterned passivation layer 160 covers the first patterned passivation layer 150, the gate insulating layer 120, and the source 130s and the drain 130d.

In this embodiment, as the portion 140a of the channel layer 140 exposed between the source 130s and the drain 130d is covered by the first patterned passivation layer 150, the channel layer 140 is prevented from being influenced by the external environment, and therefore the thin film transistor 100 has favorable stability. Moreover, the second patterned passivation layer 160 can be formed by coating and other suitable methods, and thus the processes (i.e., PECVD) causing the diffusion of hydrogen ions are not required. Hence, the device characteristics of the thin film transistor are not deteriorated by the forming method of the passivation layer.

Generally, an aluminum oxide film is a good barrier for blocking moisture and hydrogen ions. However, the aluminum oxide film has a shortage of low deposition rate, which resulting in the etching undercut, and thus the fabrication time of the TFT is increased and the conductive layer formed on the metal oxide passivation layer is likely to be broken. As such, the TFT having the metal oxide passivation layer is not suitable for mass production. In this embodiment, the first patterned passivation layer is formed by a metal oxide such as aluminum oxide, and then the second patterned passivation layer is formed by an organic material. By combining the first and second patterned passivation layers, the first patterned passivation layer having a small thickness can have favorable blocking effects, and thus the fabrication time of the metal oxide passivation layer is greatly reduced and the method of fabrication the thin film transistor of the invention is suitable applied for mass production. Particularly, the combination with the first and second patterned passivation layers can efficiently prevent the moisture and the hydrogen ions from diffusion into the channel layer. On the other hand, the capacity coupling effect is likely to occur when using the metal oxide (i.e., aluminum oxide) having high dielectric constant as passivation layers, and in this embodiment, the double-layer passivation structure constituting of the first and second patterned passivation layers can prevent the capacity coupling effect efficiently. In other words, the TFT of the embodiment has desired device characteristics and stability, and fabrication time thereof is greatly reduced. The following describes an experimental example to verify the effects described by the disclosure.

EXPERIMENTAL EXAMPLE

In order to verify that the thin film transistor according to the above embodiments has better device characteristics, an experimental example is compared with a comparative example. The thin film transistor according to the experimental example has a structure as shown in FIG. 1F, wherein the material of the first patterned passivation layer is aluminum oxide, the thickness of the first patterned passivation layer is 10 nm, the material of the second patterned passivation layer is acrylic polymer, and the thickness of the second patterned passivation layer is 1.5 um. The thin film transistor according to the comparative example has a structure similar to the thin film transistor according to the experimental example, except that the thin film transistor according to the comparative example doesn't have the second patterned passivation layer. In other words, the thin film transistor according to the comparative example only has the first patterned passivation layer, wherein the material of the first patterned passivation layer is aluminum oxide, and the thickness of the first patterned passivation layer is 10 nm. A stability test is performed on the thin film transistors according to the experimental and comparative examples under a gate-to-source voltage of 50 V and a temperature of 80° C., and the stability of the thin film transistors is determined according to the shifting degree of the threshold voltage of the thin film transistors.

Figure 3A:
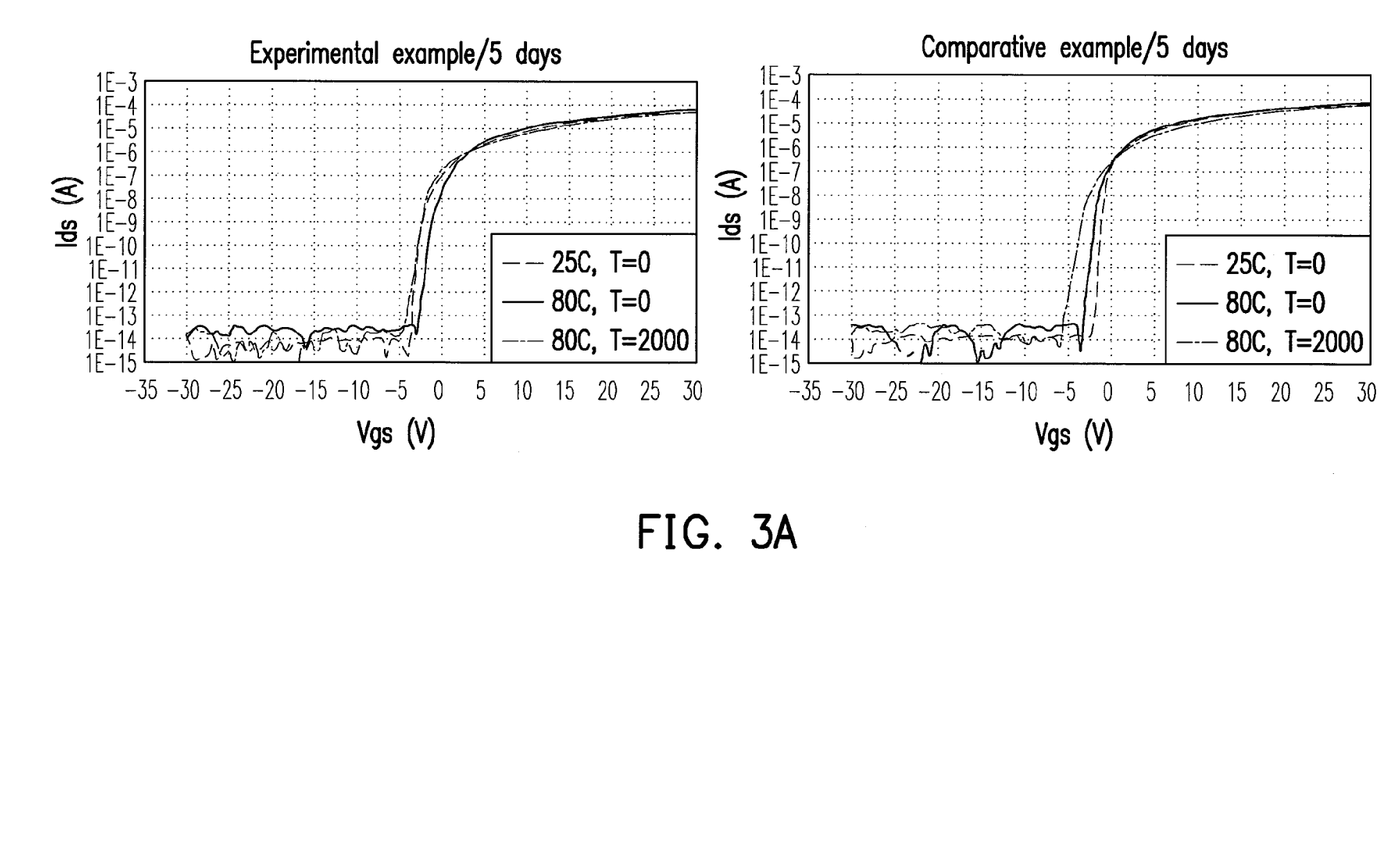
FIG. 3A to FIG. 3C show the relationship between gate-to-source voltage (Vgs) and drain-source current (Ids) of the thin film transistors of the experimental and comparative examples after operated for 5, 10, and 20 days.
Figure 3B:
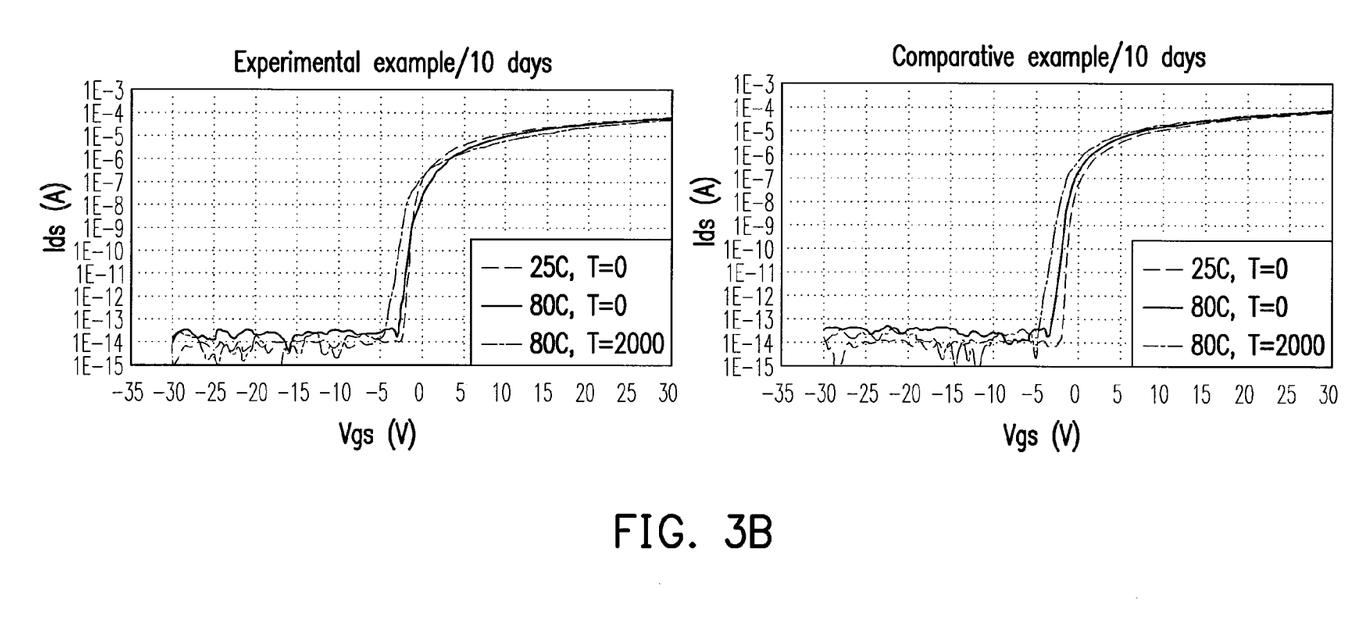
Figure 3C:
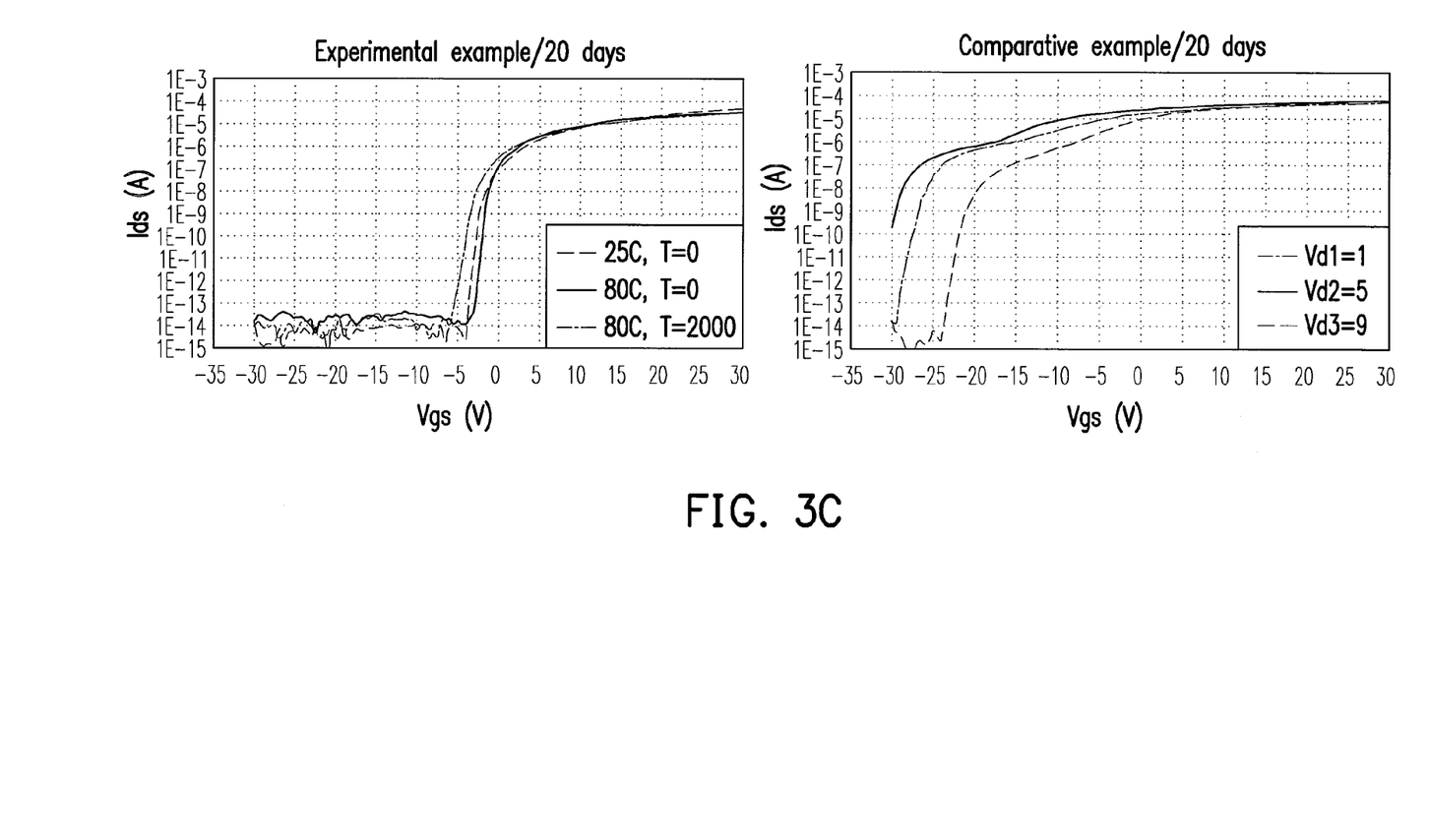

FIG. 3A to FIG. 3C show the relationship between gate-to-source voltage (Vgs) and drain-source current (Ids) of the thin film transistors of the experimental and comparative examples after operated for 5, 10, and 20 days. According to FIGS. 3A and 3B, the stability of the thin film transistor of the experimental example is similar to the stability of the thin film transistor of the comparative example after operated for 5 and 10 days. According to FIG. 3C, after operated for a long period of 20 days, compared with the thin film transistor according to the experimental example, the shift degree of the threshold voltage of the thin film transistor according to the comparative example is much more serious. That is, in the thin film transistor according to the comparative example, the device characteristics are deteriorated and the stability is greatly reduced after operated for 20 days, and therefore a stability test under different pressures is not required to perform. On the contrary, according to the stability tests, the device characteristics of the thin film transistor according to the experimental example are not deteriorated and the stability of the same is satisfactory. Hence, according to the above results, compared with the thin film transistor having a single-layer passivation structure, the thin film transistor of the invention which has a double-layer passivation structure constituting of the first and second patterned passivation layers has superior stability. It is believed that the combination of the first and the second patterned passivation layers prevents external moisture and hydrogen ions from diffusing into the channel layer, and therefore the stability is improved.

In view of the foregoing, in the thin film transistor and the fabrication method thereof of the invention, the first patterned passivation layer including metal oxide and the channel layer are patterned simultaneously, and the second patterned passivation layer is then formed on the first patterned passivation layer, wherein the thickness of the first patterned passivation layer ranges from 50 angstroms to 300 angstroms. As such, the combination of the first and the second patterned passivation layers efficiently prevent external moisture and hydrogen ions from diffusing into the channel layer and decrease the capacitive coupling effects between the metal layers. Therefore, the thin film transistor has favorable stability. Moreover, as the second patterned passivation layer is coexisting, the first patterned passivation layer can be formed with a relatively small thickness, and thus the sputtering time and the etching time of the TFT can be reduced. Particularly, the channel layer and the first passivation layer are formed by using the same photomask, so that the fabrication time of the thin film transistor is greatly reduced and the method of fabricating the thin film transistor of the invention is suitable applied for mass production. In addition, the etching undercut of the first patterned passivation layer due to low etching rate is prevented. Moreover, as the channel layer and the first patterned passivation layer are formed in vacuum, the interface between the channel layer and the first patterned passivation layer is prevented from being contaminated. Accordingly, the TFT of the invention has desired device characteristics and stability, and fabrication time thereof is greatly reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A thin film transistor, comprising:
 a substrate;
 a gate, disposed on the substrate;
 a gate insulating layer, disposed on the gate;
 a source and a drain, disposed on the gate insulating layer, wherein the source, the drain and the gate insulating layer together form a hollow;
 a channel layer, disposed under the source and the drain, wherein a portion of the channel layer is exposed by the hollow between the source and the drain;
 a first patterned passivation layer, disposed completely within the hollow and contacting the portion of the channel layer, wherein the first patterned passivation layer includes a metal oxide, the first patterned passivation layer has a thickness ranging from 50 angstroms to 300 angstroms; and a second patterned passivation layer, covering the first patterned passivation layer and disposed within the hollow.

2. The thin film transistor as claimed in claim 1, wherein the metal oxide comprises Al2O3, TiOx, HfOx, or TaOx.

3. The thin film transistor as claimed in claim 1, wherein the second patterned passivation layer further covers the gate insulating layer, the source and the drain, and the second patterned passivation layer comprises an organic insulating material.

4. The thin film transistor as claimed in claim 3, wherein the organic insulating material comprises acrylic polymer, cycloolefin polymer, epoxy resin, siloxane, fluorine polymer, or a combination thereof.

5. The thin film transistor as claimed in claim 1, wherein a thickness of the second patterned passivation layer ranges from 0.2 um to 3 um.

6. The thin film transistor as claimed in claim 1, wherein a material of the channel layer comprises IGZO, ZnO, SnO, or SnO2.

7. The thin film transistor as claimed in claim 1, wherein the channel layer is disposed between the gate insulating layer and the source and the drain.

8. The thin film transistor as claimed in claim 1, wherein a top surface of the first patterned passivation layer is lower than that of the source and drain.

9. The thin film transistor as claimed in claim 1, wherein an upper surface area of the portion of the channel layer and a lower surface area of the first patterned passivation layer have same size.

* * * * *